United States Patent
Snider et al.

(10) Patent No.: US 6,982,594 B2
(45) Date of Patent: Jan. 3, 2006

(54) SYSTEM FOR DEVELOPING A SECONDARY CONTROL SIGNAL IN A POWER AMPLIFIER CONTROL LOOP

(75) Inventors: James R. Snider, Irvine, CA (US); Jason D. Millard, Irvine, CA (US)

(73) Assignee: Skyworks Solutions Inc., Irvine, CA (US)

( * ) Notice: Subject to any disclaimer, the term of this patent is extended or adjusted under 35 U.S.C. 154(b) by 3 days.

(21) Appl. No.: 10/712,136

(22) Filed: Nov. 13, 2003

(65) Prior Publication Data

US 2005/0104657 A1   May 19, 2005

(51) Int. Cl.
H03G 3/20   (2006.01)
(52) U.S. Cl. .................. 330/140; 330/129; 330/279
(58) Field of Classification Search .................. 330/85, 330/138, 140, 279, 290
See application file for complete search history.

(56) References Cited

U.S. PATENT DOCUMENTS

| 4,124,825 | A | * | 11/1978 | Webb et al. ................. 330/279 |
| 4,360,787 | A | * | 11/1982 | Galpin ........................ 330/284 |
| 5,043,672 | A | * | 8/1991 | Youn .......................... 330/129 |
| 5,430,410 | A | * | 7/1995 | Raynaud et al. ............ 330/279 |
| 5,724,003 | A | * | 3/1998 | Jensen et al. ............... 330/129 |
| 6,670,849 | B1 | * | 12/2003 | Damgaard et al. .......... 330/129 |
| 6,816,013 | B2 | * | 11/2004 | Kao ........................... 330/279 |

* cited by examiner

Primary Examiner—Khanh V. Nguyen

(57) ABSTRACT

A power control loop for a power amplifier is disclosed. Embodiments of the power control loop include deriving a secondary control signal. The secondary control signal may be used to control a gain applied to the power signal in the power control loop and to control a supply current or voltage delivered to a power amplifier.

18 Claims, 7 Drawing Sheets

SYSTEM FOR DEVELOPING A SECONDARY CONTROL SIGNAL IN A POWER AMPLIFIER CONTROL LOOP

BACKGROUND OF THE INVENTION

1. Field of the Invention

This invention relates generally to controlling the output power of a power amplifier. More particularly, the invention relates to a power control loop for preventing power amplifier saturation in a portable communication handset. The invention also improves efficiency by reducing power consumption in a power amplifier.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld, telephone-like communication handset, also referred to as a portable transceiver. The different modulation and transmission schemes each have advantages and disadvantages.

As these mobile communication systems have been developed and deployed, many different standards have evolved, to which these systems must conform. For example, in the United States, many portable communications systems comply with the IS-136 standard, which requires the use of a particular modulation scheme and access format. In the case of IS-136, the modulation scheme is narrow band offset $\pi/4$ differential quadrature phase shift keying ($\pi/4$-DQPSK), and the access format is TDMA.

In Europe, the global system for mobile communications (GSM) standard requires the use of the gaussian minimum shift keying (GMSK) modulation scheme in a narrow band TDMA access environment, which uses a constant envelope modulation methodology.

Furthermore, in a typical GSM mobile communication system using narrow band TDMA technology, a GMSK modulation scheme supplies a low noise phase modulated (PM) transmit signal to a non-linear power amplifier directly from an oscillator. In such an arrangement, a highly efficient, non-linear power amplifier can be used thus allowing efficient modulation of the phase-modulated signal and minimizing power consumption. Because the modulated signal is supplied directly from an oscillator, the need for filtering, either before or after the power amplifier, is minimized. Further, the output in a GSM transceiver is a constant envelope (i.e., a non time-varying amplitude) modulation signal.

Regardless of the type of modulation methodology employed, the output power supplied by the power amplifier must be controlled to provide the most efficient power level for the conditions under which the communication handset is operating. For example, in the GSM communication system, the power amplifier transmits in bursts and must be able to control the ramp-up of the transmit power as well as have a high degree of control over the output power level over a wide power range. This power control is typically performed using a feedback loop in which a portion of the signal output from the power amplifier is compared with a reference signal and the resulting error signal is fed back to the control input of the power amplifier.

In some other communication systems, the output power is controlled by a signal from the base station with which the portable transceiver is communicating. Typically, in such an arrangement, the base station simply sends a signal to the portable transceiver instructing the portable transceiver to increase or decrease power. In such systems, there is no specific power requirement, just the command to either increase or decrease power output.

Regardless of the type of power control employed, the output of the power amplifier is preferably controlled in precise steps. For communication handsets that use a bipolar transistor power amplifier, the output of the power amplifier is controlled by a control signal that is applied to the base terminal of the final stage (if multiple amplifier stages are employed) of the power amplifier. This is commonly referred to as the "base bias current."

As the conditions (e.g., temperature, battery voltage, antenna impedance, etc.) under which the communication handset operates vary, the power control loop acts to maintain the output power of the power amplifier constant by adjusting the base bias current. Increasing the base bias current generally causes the output of the power amplifier to increase.

While a conventional power control loop provides some control over the power output, some problems may arise. For example, if the base bias current increases past a certain level, the power amplifier is susceptible to failure. This can happen, for example, if the impedance of the antenna abruptly changes due to, for example, a change in the position of the portable transceiver relative to nearby reflective surfaces.

Another problem with a conventional power control loop is that the ratio of the base bias current to the output power characteristic is non-linear. At higher power levels, the level of the base bias control current must be disproportionately (i.e., non-linearly) raised to achieve a commensurate increase (in dB) in output power. This causes the "loop gain" of the power control loop to decrease at higher output power levels, which lengthens the response time of the power control loop. This manifests as an inability to quickly shut off the transmitter, which is a problem in systems such as GSM in which a burst transmission methodology demands fast power ramp-up and ramp-down times. Power amplifier control is generally viewed from a voltage perspective, hence the gain of the PA is the represented by the change in output power (in volts RMS) caused by a change in the power amplifier control voltage. The primary cause of amplifier saturation in such a system is caused by having an integrator in the forward path of the power control loop. If the power control loop can't drive the error signal to zero, the integrator will simply "wind up" and raise the power amplifier control voltage to maximum. On power ramp down, the integrator will "unwind," thus causing a delay.

Regardless of the type of power control system employed, as the supply voltage to the power amplifier decreases, the maximum output power of the power amplifier also decreases. Saturation of the power amplifier occurs when output of the power amplifier no longer responds to the control signal applied to the power amplifier. Typically a power amplifier will operate most efficiently near the point of saturation.

In the past, detection of power amplifier saturation was accomplished by making a number of measurements of a power amplifier circuit in a laboratory environment during the design of the power amplifier, while reducing the occurrence of power amplifier saturation was accomplished by reducing the output of the power amplifier via a number of trial and error steps. Currently, power control loop saturation detection is not performed. Instead, sufficient margin is built into the power control loop to ensure that the power amplifier never enters saturation during normal operating conditions. For instance, the power amplifier control loop typically operates at least at approximately 0.5 dB from the saturation point of the power amplifier.

Unfortunately, these methods for detecting and reducing the occurrence of power amplifier saturation are cumbersome, fail to provide dynamic control over power amplifier saturation, and fail to maximize the performance of the power amplifier.

Further, reducing power consumption in a power amplifier is typically the most effective manner in improving the overall efficiency of a portable communication handset.

Therefore it would be desirable to provide a power control loop for a power amplifier that detects and corrects power amplifier saturation. It is also desirable to minimize power consumption in a power amplifier by operating the power amplifier as close to, but not within the region of saturation of the power amplifier.

SUMMARY

Embodiments of the invention include using a first power control loop to derive a secondary control signal. The secondary control signal may be used to dynamically alter the gain of a feedback signal in the first power control loop to reduce the power output of the power amplifier to keep the power amplifier out of saturation. The secondary control signal may also be used to vary the power supplied to a power amplifier to minimize the power consumed by the power amplifier.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
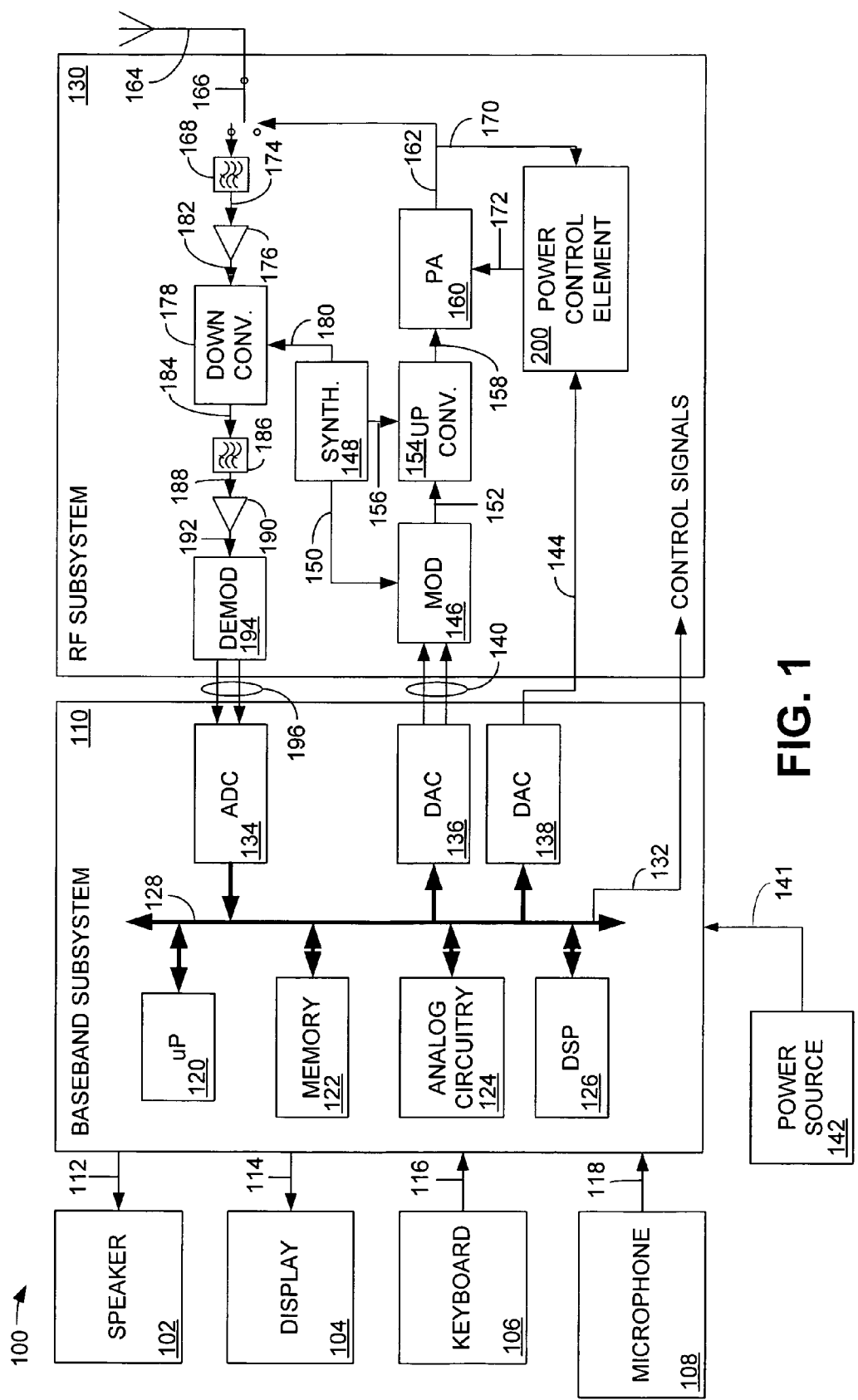
FIG. 1 is a block diagram illustrating a simplified portable transceiver.

Although described with particular reference to a portable transceiver, the system for developing a secondary control signal in a power amplifier control loop (referred to below as the "system for developing a secondary control signal") can be implemented in any system that uses a power amplifier.

The system for developing a secondary control signal can be implemented in software, hardware, or a combination of software and hardware. In a preferred embodiment, the system for developing a secondary control signal may be implemented in hardware. The hardware of the invention can be implemented using specialized hardware elements and logic. If portions of the system for developing a secondary control signal are implemented in software, the software portion can be stored in a memory and be executed by a suitable instruction execution system (microprocessor). The hardware implementation of the system for developing a secondary control signal can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

The software of the system for developing a secondary control signal comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100 including the system for developing a secondary control signal. The portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 141 to provide power to the portable transceiver 100. In a particular embodiment, portable transceiver 100 can be, for example but not limited to, a portable telecommunication handset such as a mobile/cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (µP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110. Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to radio frequency (RF) subsystem 130 via connection 132. Although shown as a single connection 132, the control signals may originate from DSP 126 or from microprocessor 120, and are supplied to a variety of points within RF subsystem 130. It should be noted that, for simplicity, only the basic components of portable transceiver 100 are illustrated herein.

Baseband subsystem 110 also includes analog-to-digital converter (ADC) 134 and digital-to-analog converters (DACs) 136 and 138. Although DACs 136 and 138 are illustrated as two separate devices, it is understood that a single digital-to-analog converter may be used that performs the function of DACs 136 and 138. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to RF subsystem 130 via connection 140. DAC 138 provides a reference voltage power level signal to power control element 200 via connection 144. Connection 140, while shown as two directed arrows, includes the information that is to be transmitted by RF subsystem 130 after conversion from the digital domain to the analog domain.

RF subsystem 130 includes modulator 146, which, after receiving a frequency reference signal, also called a "local oscillator" signal, or "LO," from synthesizer 148 via connection 150, modulates the received analog information and provides a modulated signal via connection 152 to upconverter 154. In a constant envelope modulation methodology, the modulated transmit signal generally includes only phase information. In a variable envelope modulation system, the modulated transmit signal may include both phase and amplitude information. Upconverter 154 also receives a frequency reference signal from synthesizer 148 via connection 156. Synthesizer 148 determines the appropriate frequency to which the upconverter 154 upconverts the modulated signal on connection 152.

Upconverter 154 supplies the modulated signal via connection 158 to power amplifier 160. Power amplifier 160 amplifies the modulated signal on connection 158 to the appropriate power level for transmission via connection 162 to antenna 164. Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132. Alternatively, the switch 166 may be replaced by a filter pair (e.g., a duplexer) that allows simultaneous passage of both transmit signals and receive signals, as known in the art.

A portion of the amplified transmit signal energy on connection 162 is supplied via connection 170 to power control element 200. The power control element 200 generally forms a closed power control feedback loop to control the output power of power amplifier 160 and may also supply a power control feedback signal via connection 172. The power control element is linear in that the feedback signal, 170 is converted to a signal that is monotonic and linear with respect to output power of the power amplifier 160 measured in RMS volts when using an RF peak voltage detector. The power amplifier 160 is monotonic with respect to the power amplifier control voltage signal supplied over connection 172.

In accordance with an embodiment of the invention, the power control element 200 includes a secondary power control loop that derives a secondary control signal using an error signal generated in the first, or primary, power control loop. The secondary control signal may be used to, for example, adjust the feedback gain of the primary power control loop to prevent the power amplifier 160 from entering saturation. Alternatively, the secondary control signal may be used to adjust the amount of power, either by adjusting voltage, current, or a combination of voltage and current, supplied to the power amplifier. Minimizing the amount of power supplied to the power amplifier maximizes the operating efficiency of the power amplifier and increases the battery life of the portable transceiver 100. These embodiments will be described in detail below.

A signal received by antenna 164 is directed to receive filter 168. Receive filter 168 filters the received signal and supplies the filtered signal on connection 174 to low noise amplifier (LNA) 176. Receive filter 168 is a band pass filter, which passes all channels of the particular cellular system in which the portable transceiver 100 is operating. As an example, for a 900 MHz GSM system, receive filter 168 would pass all frequencies from 935 MHz to 960 MHz, covering all 124 contiguous channels of 200 kHz each. The purpose of this filter is to reject all frequencies outside the desired region. LNA 176 amplifies the comparatively weak signal on connection 174 to a level at which downconverter 178 can translate the signal from the transmitted frequency to an IF frequency. Alternatively, the functionality of LNA 176 and downconverter 178 can be accomplished using other elements, such as, for example but not limited to, a low noise block downconverter (LNB).

Downconverter 178 receives a frequency reference signal, also called a "local oscillator" signal, or "LO," from synthesizer 148, via connection 180, which signal instructs the downconverter 178 as to the proper frequency to which to downconvert the signal received from LNA 176 via connection 182. The downconverted frequency is called the intermediate frequency or IF. Downconverter 178 sends the downconverted signal via connection 184 to channel filter 186, also called the "IF filter." Channel filter 186 filters the downconverted signal and supplies it via connection 188 to amplifier 190. The channel filter 186 selects the one desired channel and rejects all others. Using the GSM system as an example, only one of the 124 contiguous channels is actually to be received. After all channels are passed by receive filter 168 and downconverted in frequency by downconverter 178, only the one desired channel will appear precisely at the center frequency of channel filter 186. The synthesizer 148, by controlling the local oscillator frequency supplied on connection 180 to downconverter 178, determines the selected channel. Amplifier 190 amplifies the received signal and supplies the amplified signal via connection 192 to demodulator 194. Demodulator 194 recovers the transmitted analog information and supplies a signal representing this information via connection 196 to ADC 134. ADC 134 converts these analog signals to a digital signal at baseband frequency and transfers the signal via bus 128 to DSP 126 for further processing. As an alternative, the downconverted carrier frequency (IF frequency) at connection 184 may be 0 Hz, in which case the receiver is referred to as a "direct conversion receiver." In such a case, the channel filter 186 is implemented as a low pass filter, and the demodulator 194 may be omitted.

Figure 2:
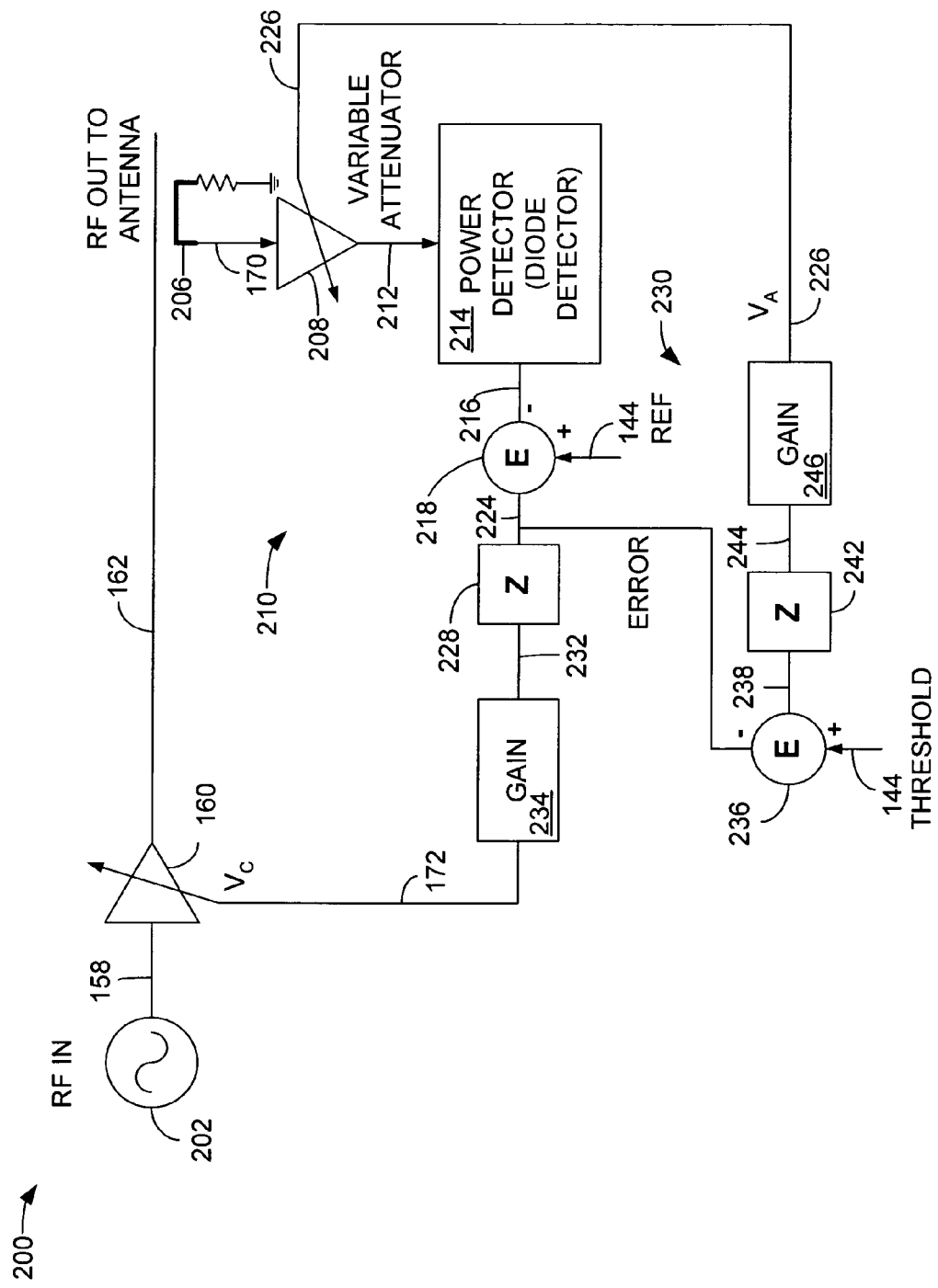
FIG. 2 is a block diagram illustrating a first embodiment of the power control element of FIG. 1.

FIG. 2 is a block diagram illustrating a first embodiment of the power control element 200 of FIG. 1. For simplicity, the function of the modulator 146 and the upconverter 154 of FIG. 1 are illustrated in FIG. 2 using oscillator 202. Oscillator 202, which may be a voltage controlled oscillator (VCO), supplies a low-noise modulated signal (i.e, a signal with very low out-of-band noise) via connection 158 to the power amplifier 160. By using an oscillator 202 to supply a low-noise modulated signal to power amplifier 160, the need for filtering before and after the power amplifier 160 may be reduced or eliminated.

A portion of the output power present on connection 162 is diverted by coupler 206 via connection 170 to a variable attenuator 208. As will be described below, the variable attenuator is controlled using a secondary control signal supplied via connection 226. The variable attenuator may be implemented as, for example, a pin diode or may be a variable gain amplifier. The output of the variable attenuator 208 is supplied to a power detector 214. The power detector 214 may be a diode detector or any other element for measuring the level of the power on connection 212. The power detector 214 receives the RF signal on connection 212 and provides, on connection 216, an analog signal representing the level of the RF power signal present on connection 162.

The output of the power detector 214 is referred to as a "feedback voltage" or "feedback signal" and is proportional to the RMS output voltage of the power amplifier 160. The feedback voltage signal is supplied on connection 216 to a summing element 218. The summing element 218 determines the difference between the value of the signal on connection 216 and a reference signal applied via connection 144. The reference signal is a ramping waveform that the power control loop will track. Under normal conditions, the primary power control loop 210 will track the signal on connection 144 and provides a controlled ramp up and ramp down, along with steady state output power during the useful part of a transmission burst. In this embodiment, a reference voltage power control signal from the DAC 138 of FIG. 1 is supplied via connection 144 to the summing element 218. The summing element 218 compares the signal level on connection 216 with the signal level on connection 144. The output of the summing element 218 on connection 224 is an error signal representing the difference in value of the signals on connections 216 and 144.

The error signal on connection 224 is supplied to an integrator 228. The integrator 228 integrates over time the error signal on connection 224 and provides an integrated error signal on connection 232. The integrated error signal on connection 232 is supplied to a gain element 234. The gain element 234 amplifies the integrated error signal and supplies a control signal via connection 172 to the power amplifier 160. In one example implementation, the summing element 218 and the integrator 228 can be implemented as a differentiating integrator. However, in such an implementation, the derivative of the output of the differentiating integrator would constitute the error signal. If the integrator has gain, then the error signal would be amplified.

When supplied as a voltage signal, the integrated error signal may be represented as $V_C$. The integrated error signal is used as a primary power amplifier control signal that is supplied to the control input of the power amplifier 160 via connection 172. Under steady state conditions, the values of the signals on connections 216 and 144 are equal.

The variable attenuator 208, power detector 214 and the comparator 218 form a first, or primary, power control loop 210.

The error signal on connection 224 is also supplied to a second summing element 236. The second summing element 236 is similar to the summing element 218. The error signal on connection 224 is supplied to the inverting input of the summing element 236, while a threshold signal is supplied to the non-inverting input of the summing element 236 via, for example, connection 144. The threshold signal is preferably a small (near zero) voltage signal. During normal operation the error signal on connection 224 will be zero, but under saturation conditions it could be quite large. When the error signal exceeds about 100 mV (threshold voltage), the secondary power control loop 230 operates to drive the value of the error signal to a value less than the value of the threshold signal. The threshold signal on connection 144, while not the same as the reference signal supplied to the summing element 218, may also originate from the baseband. For example, the threshold signal on connection 144 could be a DAC output or a simple logic signal (high=2.7 V, low=0 V). The summing element 236 determines the difference between the value of the error signal on connection 224 and the value of the threshold signal supplied to the inverting input via connection 144. The value of the threshold signal is empirically determined based on system performance parameters.

The output of the summing element 236 on connection 238 is supplied to a second integrator 242. The second integrator 242 is similar to the integrator 228 and integrates over time the signal on connection 238 and provides an integrated signal on connection 244. The integrated signal on connection 244 is supplied to a gain element 246, which is similar to the gain element 234. The gain element 246 amplifies the integrated signal and supplies a secondary control signal via connection 226 to the variable attenuator 208.

If the error signal on connection 224 is non-zero, then the summing element 236 generates a secondary control signal that is supplied to the control input of the variable attenuator 208 via connection 226. In this example, the signal on connection 226 is a voltage signal that controls the attenuation of the variable attenuator, and is referred to as $V_A$. Under normal operating conditions the error signal on connection 224 will be zero. This causes the output of the summer 236 to be positive and the output of the integrator will be driven toward the system voltage level. As the level of the secondary control signal on connection 226 decreases, the attenuation provided by the variable attenuator 208 decreases, thereby increasing the gain of the signal in the primary power control loop 210. The variable attenuator 208, the summing element 236, integrator 242 and gain element 246 form a secondary power control loop 230 that receives as input the error signal on connection 224. In effect, by using the secondary control signal to decrease the attenuation provided by the variable attenuator 208, the level of the feedback signal on connection 216 in the primary power control loop 210 is increased. Increasing the apparent level of the feedback signal in the primary power control loop 210 reduces the power output of the power amplifier 160, thereby preventing the power amplifier 160 from operating in saturation.

Figure 3:
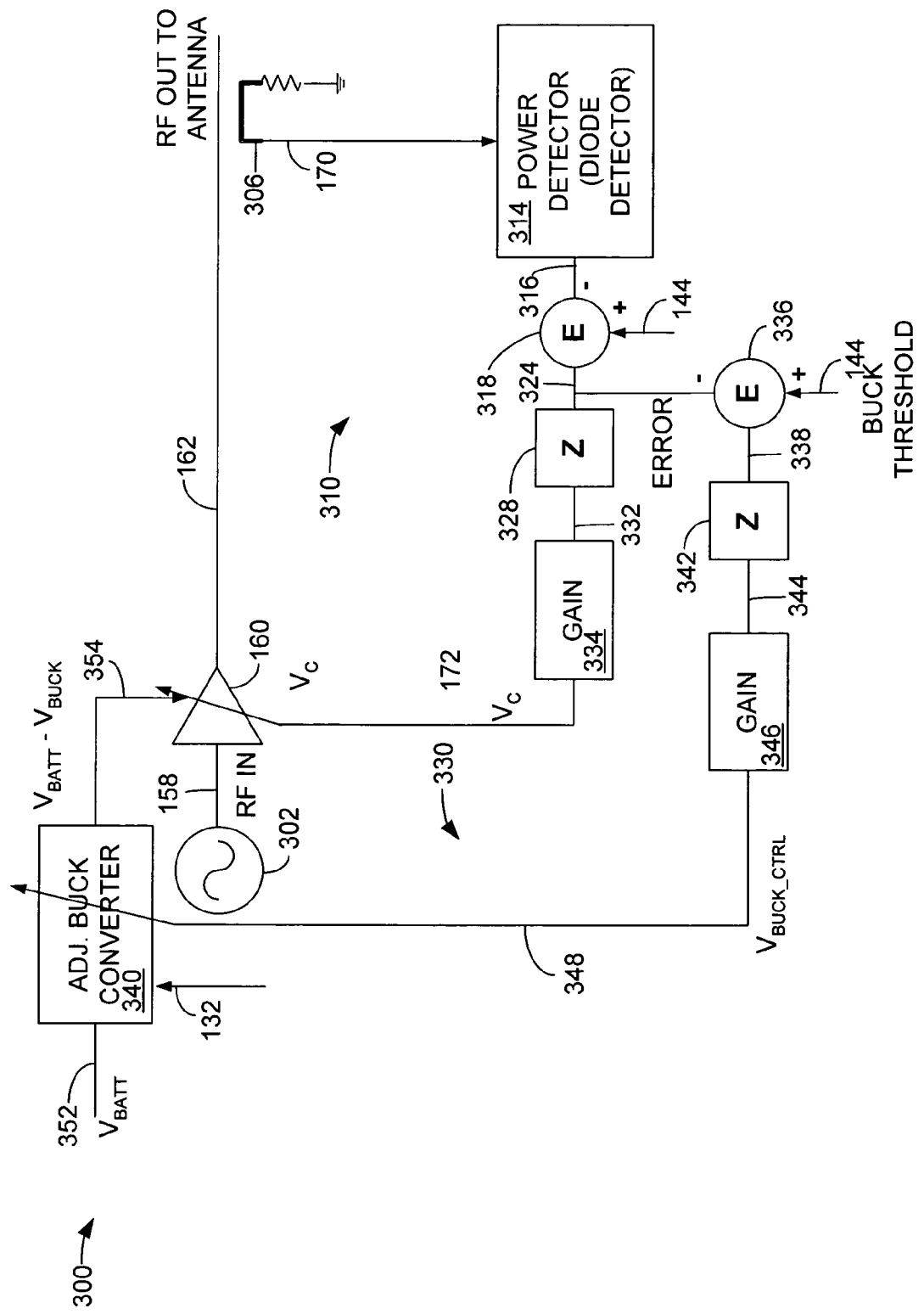
FIG. 3 is a block diagram illustrating a second embodiment of the power control element of FIG. 1.

FIG. 3 is a block diagram illustrating a second embodiment 300 of the power control element of FIG. 1. As described above with respect to FIG. 2, for simplicity, the function of the modulator 146 and the upconverter 154 of FIG. 1 are illustrated in FIG. 3 using the oscillator 302. The oscillator 302 is similar in function to the oscillator 202 of FIG. 2.

As described above with respect to FIG. 2, a portion of the output power present on connection 162 is diverted by the coupler 306 via connection 170 to a power detector 314. The power detector 314 is similar in operation to the power detector 214 of FIG. 2.

The output of the power detector 314 is proportional to the output power of the power amplifier. The feedback voltage signal is supplied on connection 316 to a summing element 318. The summing element 318 determines the difference between the value of the signal on connection 316 and a reference signal applied via connection 144. In this embodiment, a reference voltage power control signal from the DAC 138 of FIG. 1 is supplied via connection 144 to the summing element 318. The summing element 318 compares the signal level on connection 316 with the signal level on connection 144. The output of the summing element 318 on connection 324 is an error signal representing the difference in value of the signals on connections 316 and 144.

The error signal on connection 324 is supplied to an integrator 328. The integrator 328 integrates over time the error signal on connection 324 and provides an integrated error signal on connection 332. The integrated error signal on connection 332 is supplied to a gain element 334. The gain element 334 amplifies the integrated error signal and supplies a control signal via connection 172 to the power amplifier 160.

The error signal on connection 324 is supplied to the inverting input of a second summing element 336. The non-inverting input of the summing element 336 receives a threshold voltage signal (referred to in FIG. 3 as the "buck threshold") that is preferably smaller in magnitude than the threshold signal supplied to the summing element 236 in FIG. 2. The output of the summing element 336 on connection 338 is supplied to a second integrator 342. The second integrator 342 is similar to the integrator 328 and integrates over time the signal on connection 338 and provides an integrated signal on connection 344. The integrated signal on connection 344 is supplied to a gain element 346, which is similar to the gain element 334. The gain element 346 amplifies the integrated signal and supplies a secondary control signal via connection 348 to an adjustable buck converter 340.

The adjustable buck converter 340 receives battery voltage, referred to as $V_{BATT}$, on connection 352. The adjustable buck converter 340 is controlled to reduce the battery voltage to a level less than $V_{BATT}$ (referred to as $V_{BATT}-V_{BUCK}$) and reduce the level of the power supply signal on connection 354 to the power amplifier 160 when the power amplifier 160 is not operating in saturation. The adjustable buck converter is adjusted to reduce the power supplied to the power amplifier 160 until saturation is detected. The secondary control signal on connection 348 is used to control the adjustable buck converter to minimize the amount of power supplied to the power amplifier 160.

If the error signal on connection 324 is greater than the value of the buck threshold signal on connection 144, then the summing element 336 generates a secondary control signal that is supplied to the control input of the adjustable buck converter 340 via connection 348 that causes the output of the adjustable buck converter 340 to increase. If the error signal on connection 324 is less than the value of the buck threshold signal on connection 144, then the summing element 336 generates a secondary control signal that is supplied to the control input of the adjustable buck converter 340 via connection 348 that causes the output of the adjustable buck converter 340 to decrease. In this example, the signal on connection 348 is a voltage signal that controls the output of the adjustable buck converter, and is referred to as $V_{BUCK\_CTRL}$. As the level of the secondary control signal on connection 348 increases, the output of the adjustable buck converter 340 decreases, thereby decreasing the amount of power supplied to the power amplifier 160. As the level of the secondary control signal on connection 348 decreases, the output of the adjustable buck converter 340 increases, thereby increasing the amount of power supplied to the power amplifier 160. The summing element 336, integrator 342 and gain element 346 form a secondary power control loop 330 that receives as input the error signal on connection 324. In effect, by using the secondary control signal on connection 348 to decrease the output of the adjustable buck converter 340 until saturation is detected, the power consumption of the power amplifier can be reduced.

When using the secondary control signal to adjust the buck converter, it is desirable to accurately detect when the power amplifier 160 approaches saturation to prevent operation in saturation. The efficiency of the power amplifier 160 is defined by the amount of DC power ($P_{DC}$) that is supplied to the power amplifier 160 and the amount of radio frequency (RF) power ($P_{OUT}$) that is produced by the power amplifier 160. The power delivered by the battery is ($P_{DC}$)= $V_{BATT} \times I_{BATT}$, where I is the current supplied by the battery. Typically, the DC power supply efficiency is referred to as the "collector" efficiency. The battery collector efficiency equals $P_{OUT}/P_{DC}$. The voltage $V_{BATT}$ and the current $I_{BATT}$ supplied to the power amplifier 160 can be reduced while still retaining control of the power amplifier 160 until the power amplifier 160 enters saturation. An error signal on connection 324 having a positive value other than zero (0) volts is an indication that the power amplifier 160 is in saturation. By employing the adjustable buck converter 340, in series with the power source ($V_{BATT}$), it is possible to reduce the amount of current ($I_{BATT}$) consumed by the power amplifier 160. Typically, the power amplifier saturation point is directly proportional to $V_{BATT}$. This is so because, as a battery discharges, its voltage changes and the power amplifier will not operate at peak efficiency at all times. Recall that operating close to power amplifier saturation (the power at saturation is referred to as $P_{SAT}$) produces the best efficiency. The adjustable buck converter 340 will effectively reduce $P_{SAT}$ by reducing $V_{BATT}$, thus yielding an operation point close to $P_{SAT}$ and achieving optimal efficiency over the entire GSM power step range. Typically, a normal portable communication handset only achieves optimal efficiency at maximum output power, and degrades significantly as output power is reduced.

To illustrate, $I_{BATT}=(V_{BUCK} \times I_{BUCK})/(V_{BATT})$. Due to conservation of power, the amount of battery current ($I_{BATT}$) will decrease given that the voltage $V_{BATT}$ is greater than the voltage $V_{BUCK}$. Using the secondary control signal to adjust the output of the adjustable buck converter 340 to a level less than battery voltage until the power amplifier 160 approaches saturation, decreases current consumption and improves the efficiency of the power amplifier 160. In this manner, the current drawn by the power amplifier 160 is minimized and the battery life of the portable transceiver 100 is maximized.

Figure 4:
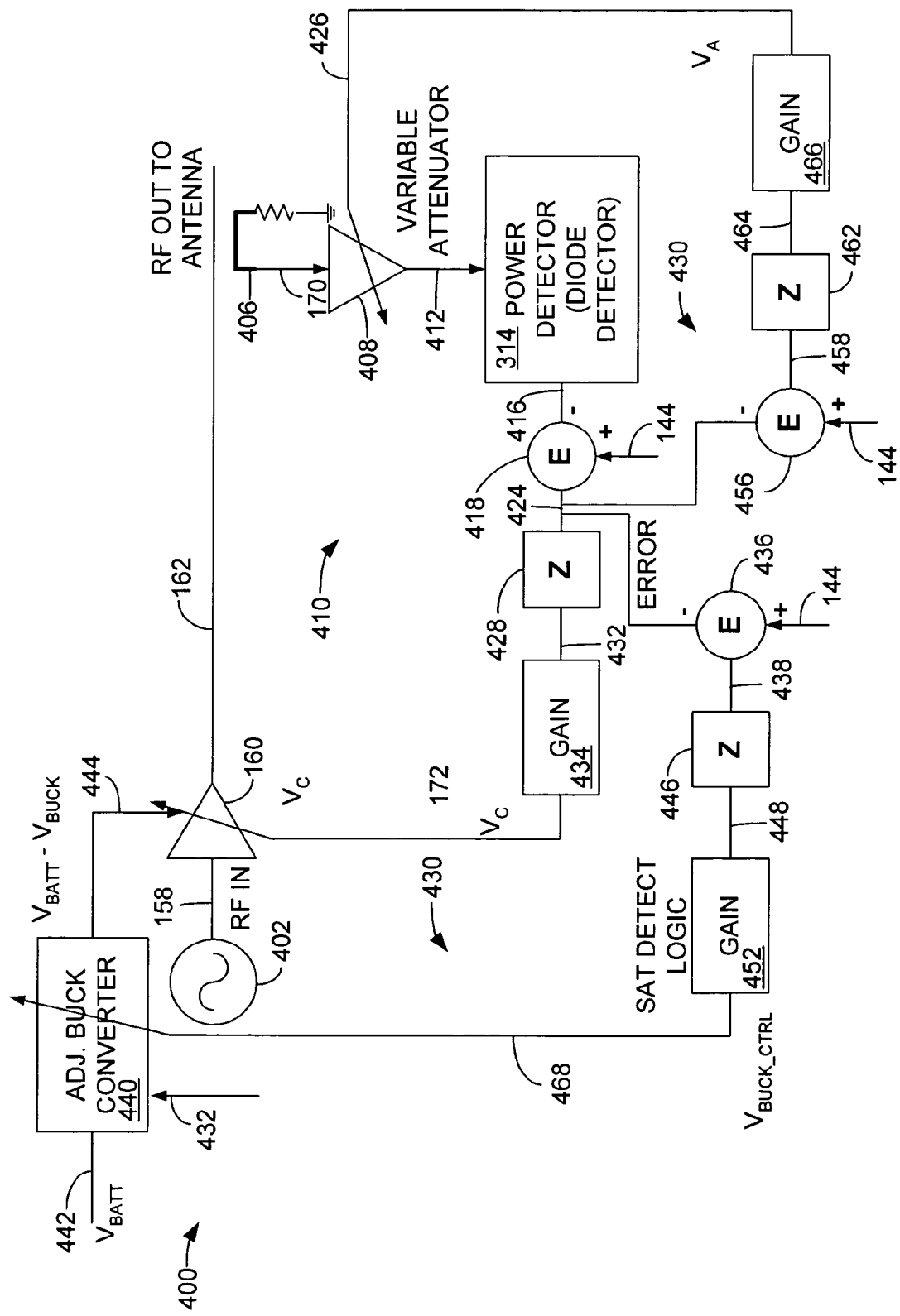
FIG. 4 is a block diagram illustrating a power control element that incorporates the first and second embodiments shown in FIGS. 2 and 3.

FIG. 4 is a block diagram illustrating a power control element 400 that incorporates the first and second embodiments shown in FIGS. 2 and 3 above. As described above, for simplicity, the function of the modulator 146 and the upconverter 154 of FIG. 1 are illustrated in FIG. 4 using the oscillator 402. The oscillator 402 is similar in function to the oscillator 202 of FIG. 2.

A portion of the output of power amplifier 160 on connection 162 is diverted by a coupler 406 via connection 170 to a variable attenuator 408. The variable attenuator 408 is similar to the variable attenuator 208 in FIG. 2. The output of a variable attenuator 408 on connection 412 is supplied to the power detector 414, which is similar to the power detector 214 of FIG. 2. The output of the power detector 414 is supplied as a feedback signal on connection 416 to the summing element 418, which is similar to the summing element 218 of FIG. 2. The summing element 418 also receives a reference voltage signal from the baseband circuitry via connection 144 as described above. The summing element 418 provides an error signal on connection 424 as described above. The error signal output from the summing element 418 is supplied to the summing element 436 and to the summing element 456. The summing element 456 is similar to the summing element 236 of FIG. 2 and the summing element 436 is similar to the summing element 336 of FIG. 3.

The secondary control signal ($V_A$) is supplied via connection 426 to control the variable attenuator 408 as described above with reference to FIG. 2, while the secondary control signal on connection 468 is used to adjust the output of the buck converter 440 so that the amount of power used by the power amplifier 160 can be minimized, as described above.

Figure 5:
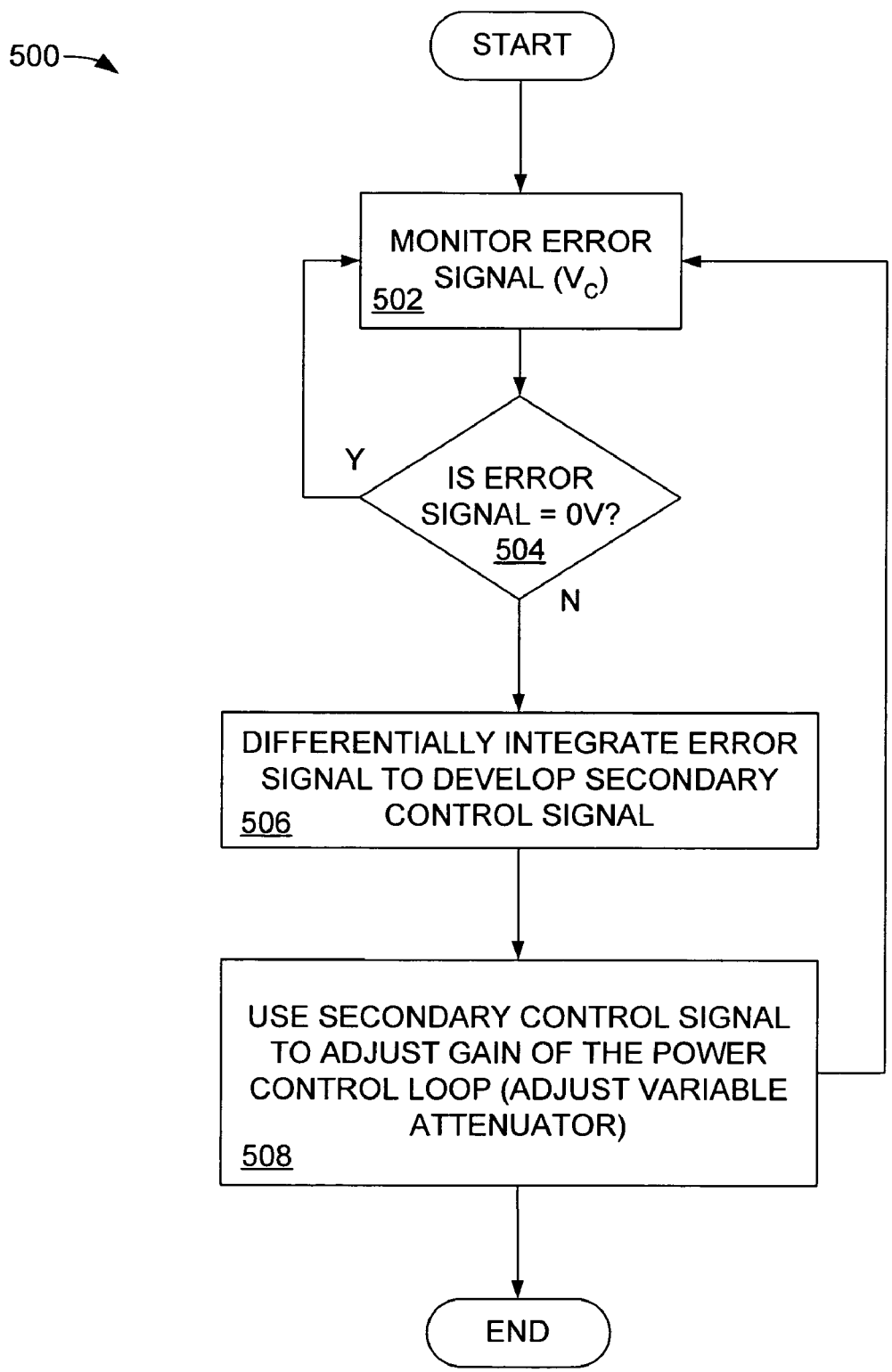
FIG. 5 is a flowchart illustrating the operation of the power control element of FIG. 2.

FIG. 5 is a flowchart 500 illustrating the operation of the power control element 200 of FIG. 2. In block 502, the error signal on connection 224 (FIG. 2) is monitored by the summing element 236. In block 504, it is determined whether the error signal is equal to zero (0) volts. An error signal equal to zero (0) volts indicates that the power amplifier 160 is operating normally and is not in saturation mode, and the process returns to block 502.

In block 504 an error signal at a positive level other than zero (0) volts indicates that the power amplifier 160 is operating in saturation mode. If the power amplifier 160 is operating in saturation mode, then, in block 506, the error signal on connection 224 is compared to the threshold signal on connection 144 and the result on connection 238 is differentially integrated by the integrator 242 (FIG. 2) to develop a secondary control signal $V_A$ on connection 226 (FIG. 2). In block 508, the secondary control signal on connection 226 is used to adjust the gain of the primary power control loop 210 by adjusting the attenuation of the variable attenuator 208. Reducing the attenuation of the variable attenuator 208 increases the gain and the apparent level of the signal in the primary power control loop 210. Increasing the apparent level of the feedback signal in the primary power control loop 210 reduces the power output of the power amplifier 160, thereby preventing the power amplifier 160 from operating in saturation.

Figure 6A:
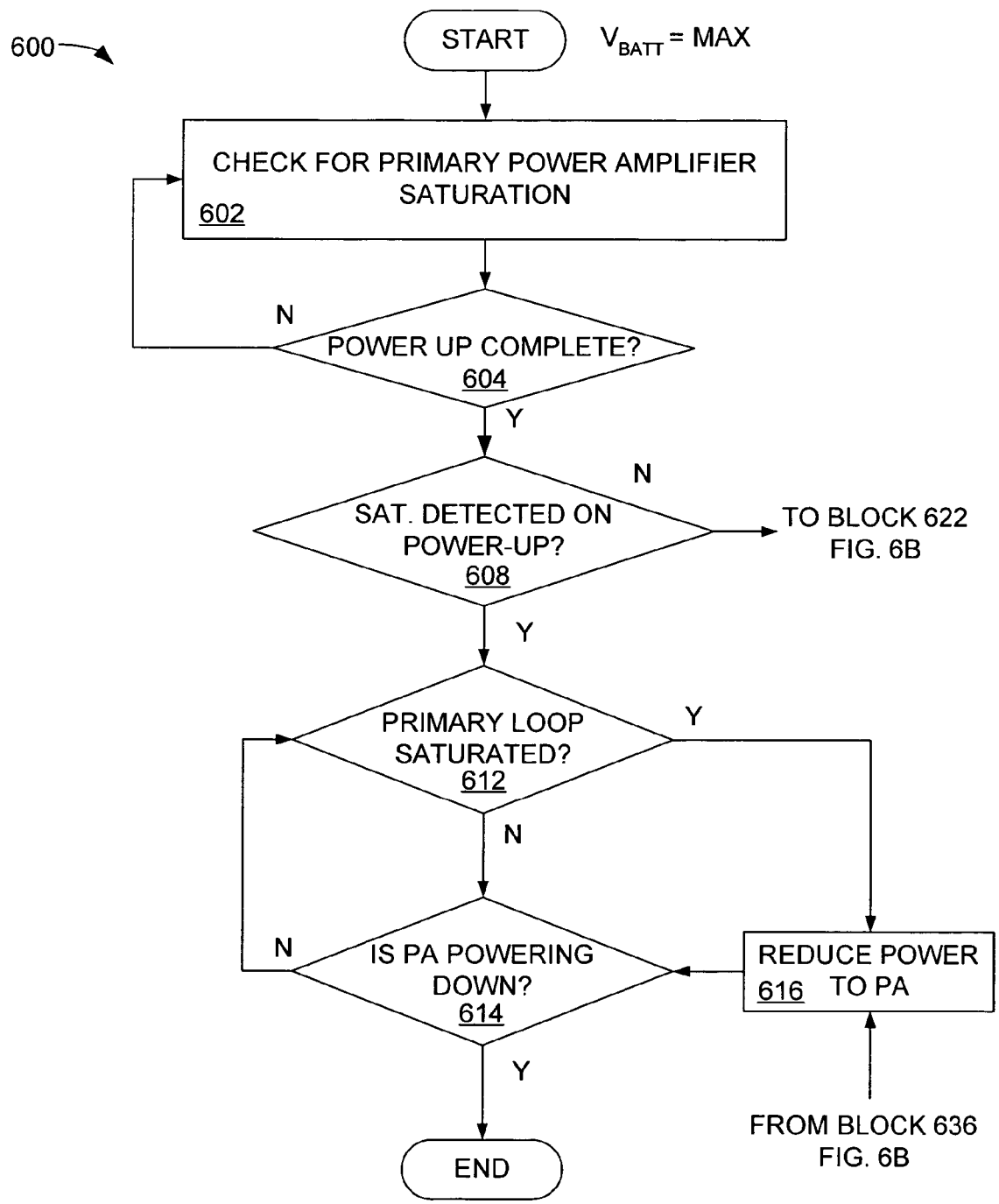
FIGS. 6A and 6B are flowcharts collectively illustrating the operation of the power control element of FIG. 3.
Figure 6B:
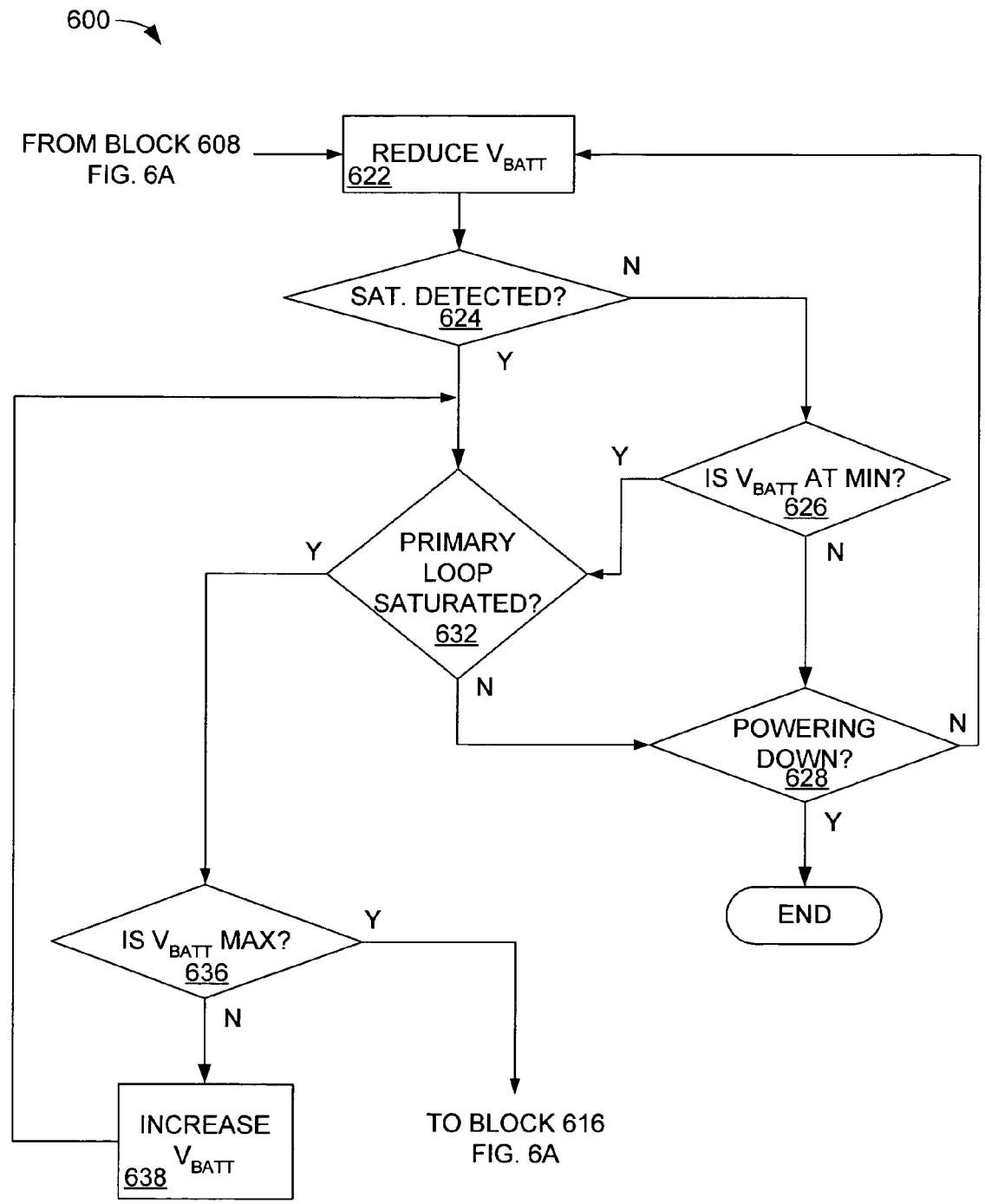

FIGS. 6A and 6B are flowcharts 600 collectively illustrating the operation of the power control element 300 of FIG. 3. The flowchart 600 begins with a maximum battery voltage ($V_{BATT}$). In block 602, during power-up of the power amplifier 160 the primary power control loop 310 (FIG. 3), and specifically, the error signal on connection 324, is monitored by the summing element 318 (FIG. 3) to determine whether the power amplifier 160 is operating in saturation. For example, if the value of the error signal on connection 324 is a value other than zero (0) volts, then the power amplifier 160 is likely saturated.

In block 604, it is determined whether the power amplifier 160 has completed its power-up cycle. If the power amplifier 160 has not completed its power-up cycle, then the process returns to block 602. If the power amplifier 160 has completed its power-up cycle, then it is determined in block 608 whether saturation has been detected upon power-up of the power amplifier 160.

If, in block 608, it is determined that saturation of the power amplifier 160 has been detected, then, in block 612 it is determined whether the primary power control loop 310 is operating in saturation. Typically, the primary power control loop 310 will saturate just prior to saturation of the power amplifier 160. However, because there is only about a 0.3–0.5 dB difference, it can be assumed that when the power control loop 310 saturates that the power amplifier is nearly saturated. If, in block 612 it is determined that the primary power control loop 310 is not saturated, then, in block 614, it is determined whether the power amplifier 160 is in a power-down mode. If the power amplifier 160 is in a power-down mode, then, the process ends. If, however, in block 614 it is determined that the power amplifier 160 is not in a power-down mode, then the process returns to block 612.

If, in block 612, it is determined that the primary power control loop 310 is saturated, then, in block 616, the adjustable buck converter 340 (FIG. 3) is adjusted to reduce the power ($I_{BATT}$) being supplied to the power amplifier 160 via connection 344.

If, in block 608, no saturation is detected upon power-up, then the process proceeds to block 622 of FIG. 6B. In block 622 of FIG. 6B the adjustable buck converter 340 (FIG. 3) is adjusted to reduce the power being supplied to the power amplifier 160.

In block 624, after reducing the power supplied to the power amplifier 160, it is determined whether saturation of the power amplifier 160 is detected. If saturation of the power amplifier is not detected, then, in block 626, it is determined whether the voltage $V_{BATT}$ is at a minimum. If the voltage $V_{BATT}$ is not at a minimum, then, in block 628 it is determined whether the power amplifier 160 is powering down. If the power amplifier 160 is powering down, then the process ends.

If, however, in block 628 it is determined that the power amplifier 160 is not powering down, then the process returns to block 622 where the adjustable buck converter 340 is again adjusted to reduce the power being supplied to the power amplifier 160 via connection 344.

If, in block 624, saturation is detected, then, in block 632, it is determined whether the primary power control loop 310 is saturated. If it is determined in block 632 that the primary power control loop 310 is not saturated, then, in block 628 it is determined whether the power amplifier 160 is powering down. If the power amplifier is powering down, then the process ends. If the power amplifier is not powering down, then the process returns to block 622 where the adjustable buck converter 306 is again adjusted so that the power being supplied to the power amplifier 160 is reduced.

If, however, in block 632 it is determined that the primary power control loop 310 is saturated, then, in block 636, it is determined whether the voltage $V_{BATT}$ is at a maximum. If the voltage $V_{BATT}$ is not at a maximum, then, in block 638, the voltage $V_{BATT}$ is increased and the process returns to block 632. If, however, in block 636 it is determined that the voltage $V_{BATT}$ is at a maximum, then, the process proceeds to block 616 of FIG. 6A, where the adjustable buck converter 306 is adjusted so as to reduce the power being supplied to the power amplifier 160.

While various embodiments of the invention have been described, it will be apparent to those of ordinary skill in the art that many more embodiments and implementations are possible that are within the scope of this invention. Accordingly, the invention is not to be restricted except in light of the following claims and their equivalents.

What is claimed is:

1. A power control system for a power amplifier, comprising:
    a first power control loop configured to provide a control signal comprising:
        a variable attenuator for adjusting a gain applied to a signal in the first power control loop;
        a detector for providing a direct current (DC) baseband signal representing an output of the power amplifier;
        a first comparator for comparing the DC baseband signal to a first reference signal and generating an error signal;
    a second power control loop comprising:
        a second comparator for comparing the error signal to a second reference signal and generating a secondary control signal capable of controlling the variable attenuator.

2. The power control system of claim 1, wherein the secondary control signal is used to control the variable attenuator to reduce attenuation in the first power control loop.

3. The power control system of claim 2, wherein the variable attenuator is a variable gain amplifier (VGA) having a maximum gain of zero dB.

4. The power control system of claim 1, further comprising an adjustable buck voltage converter responsive to the secondary control signal, the adjustable buck voltage converter configured to reduce a power supplied to the power amplifier in response to the secondary control signal.

5. The power control system of claim 4, wherein the adjustable buck voltage converter reduces supply current to the power amplifier until saturation of the power amplifier is detected.

6. The power control system of claim 1, wherein the secondary control signal is used to control the variable attenuator to reduce attenuation in the first power control loop, and further comprising:
    an adjustable buck voltage converter responsive to the secondary control signal, the adjustable buck voltage converter configured to reduce the power supplied to the power amplifier in response to the secondary control signal until saturation of the power amplifier is detected.

7. A method for operating a power control loop for a power amplifier, comprising:
    measuring a power level of a signal output from the power amplifier;
    generating an error signal by comparing the power level of the signal output from the power amplifier to a first reference signal;
    generating a primary control signal responsive to the error signal in a primary control loop;
    deriving a secondary control signal responsive to the error signal and a second reference signal; and
    using the secondary control signal to control a gain applied to the signal output from the power amplifier.

8. The method of claim 7, further comprising:
    using the secondary control signal to control a gain applied to the signal output from the power amplifier.

9. The method of claim 8, wherein the gain applied to the signal output from the power amplifier is controlled by a variable attenuator, the variable attenuator configured to receive the signal output from the power amplifier.

10. The method of claim 7, further comprising:
    using the secondary control signal to control an adjustable buck voltage converter, the adjustable buck voltage converter configured to provide a supply current to the power amplifier.

11. The method of claim 10, wherein the adjustable buck voltage converter reduces supply current to the power amplifier until saturation of the power amplifier is detected.

12. The method of claim 7, further comprising:
    using the secondary control signal to control a gain applied to the signal output from the power amplifier; and
    using the secondary control signal to control an adjustable buck voltage converter, the adjustable buck voltage converter configured to provide a supply current to the power amplifier, wherein the adjustable buck voltage converter reduces supply current to the power amplifier until saturation of the power amplifier is detected.

13. A system for operating a power control loop for a power amplifier, comprising:
    means for measuring a power level of a signal output from the power amplifier;
    means for generating an error signal by comparing the power level of the signal output from the power amplifier to a first reference signal;
    means for generating a primary control signal responsive to the error signal in a primary control loop; and
    means for deriving a secondary control signal responsive to the error signal and a second reference signal and means for using the secondary control signal to control a gain applied to the signal output from the amplifier.

14. The system of claim 13, further comprising:
    means for using the secondary control signal to control a gain applied to the signal output from the power amplifier.

15. The system of claim 14, wherein the gain applied to the signal output from the power amplifier is controlled by a variable attenuator means, the variable attenuator means for receiving the signal output from the power amplifier.

16. The system of claim 13, further comprising:
    means for using the secondary control signal to control an adjustable buck voltage converter means, the adjustable buck voltage converter means for providing a supply current to the power amplifier.

17. The system of claim 16, wherein the adjustable buck voltage converter means reduces supply current to the power amplifier until saturation of the power amplifier is detected.

18. The system of claim 13, further comprising:
    means for using the secondary control signal to control a gain applied to the signal output from the power amplifier; and
    means for using the secondary control signal to control an adjustable buck voltage converter means, the adjustable buck voltage converter means for providing a supply current to the power amplifier, wherein the adjustable buck voltage converter means reduces supply current to the power amplifier until saturation of the power amplifier is detected.

* * * * *

UNITED STATES PATENT AND TRADEMARK OFFICE
CERTIFICATE OF CORRECTION

PATENT NO. : 6,982,594 B2
APPLICATION NO. : 10/712136
DATED : January 3, 2006
INVENTOR(S) : James R. Snider et al.

It is certified that error appears in the above-identified patent and that said Letters Patent is hereby corrected as shown below:

In the claims, column 13, lines 63-65 (delete "8. The method of claim 7, further comprising: using the secondary control signal to control a gain applied to the signal input from the power amplifier.").

In claim 13, column 14, line 35, before "amplifier" insert -- power --.

In column 14, lines 36-39 (delete "14. The system of claim 13, further comprising: means for using the secondary control signal to control a gain applied to the signal input from the power amplifier.").

Signed and Sealed this

Twenty-fifth Day of December, 2007

JON W. DUDAS
*Director of the United States Patent and Trademark Office*